United States Patent [19]

Ishii et al.

[11] Patent Number: 4,947,238

[45] Date of Patent: Aug. 7, 1990

[54] SUBMOUNT FOR SEMICONDUCTOR LASER ELEMENT

[75] Inventors: Mitsuo Ishii; Seiichi Nagai; Kazuyoshi Hasegawa; Toshio Tanaka, all of Itami, Japan

[73] Assignee: Mitsubishi Denki Kabushiki Kaisha, Japan

[21] Appl. No.: 345,163

[22] Filed: May 1, 1989

[30] Foreign Application Priority Data

May 23, 1988 [JP] Japan ................................ 63-126623

[51] Int. Cl.$^5$ ..................... H01L 23/48; H01L 39/02
[52] U.S. Cl. ......................................... 357/71; 357/80
[58] Field of Search ..................... 372/34, 36; 357/80, 357/81, 71

[56] References Cited

U.S. PATENT DOCUMENTS 4,170,472 10/1979 Olsen .................................. 470/562
4,480,261 10/1984 Hattori et al. ........................ 357/71

FOREIGN PATENT DOCUMENTS 58-58786  5/1983 Japan .
58-138056 8/1983 Japan ..................................... 357/71
60-81884  5/1985 Japan .
60-103860 7/1985 Japan .

OTHER PUBLICATIONS

Olsen et al., "Improved Cost Effectiveness and Product Reliability Through Solder Alloy Development", Solid State Technology, Sep. 1981, pp. 121-126.

Primary Examiner—William L. Sikes
Assistant Examiner—Georgia Y. Epps
Attorney, Agent, or Firm—Leydig, Voit & Mayer

[57] ABSTRACT

A submount for a semiconductor laser element includes a substrate and a barrier layer disposed on opposed surfaces of the substrate and including a plurality of layers wherein the outermost layer of the barrier layers is Au and Ag. A metal alloy solder layer comprising Sn, Ag, and Sb is deposited on the barrier layers.

5 Claims, 2 Drawing Sheets

F I G .3(a).
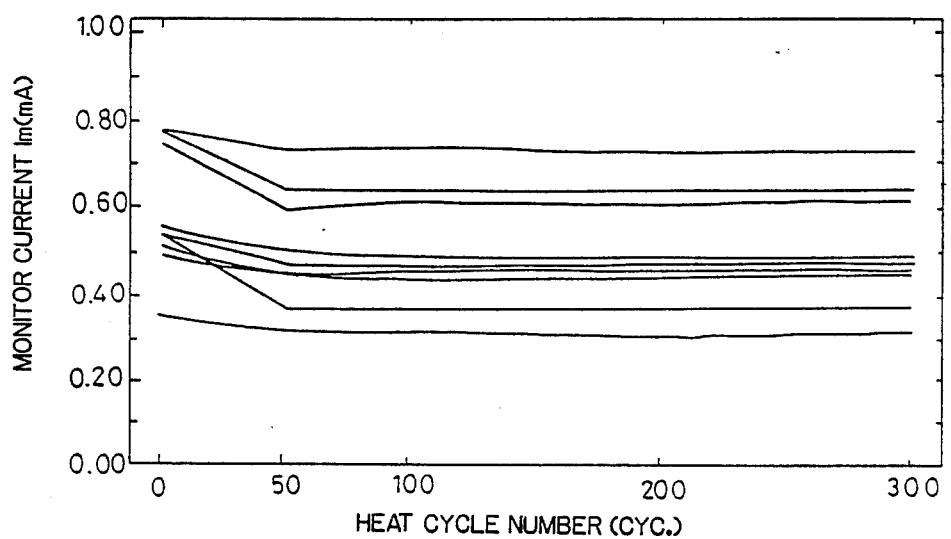
F I G .3(b).
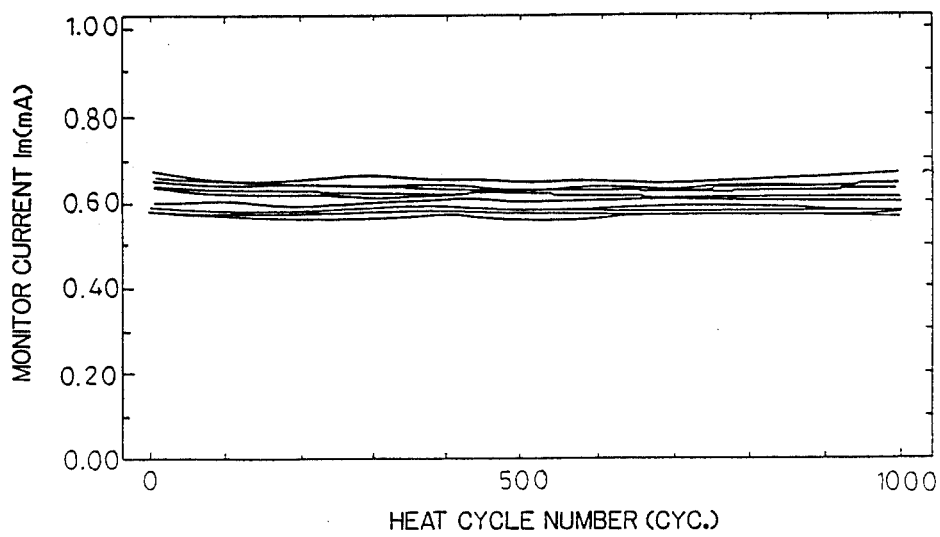

SUBMOUNT FOR SEMICONDUCTOR LASER ELEMENT

FIELD OF THE INVENTION

The present invention relates to a submount for a semiconductor laser element, and more particularly to a submont for producing a high reliability semiconductor laser element.

BACKGROUND OF THE INVENTION

FIG. 2 shows a cross-section of a structure of a Si submont for mounting a semiconductor laser chip according to the prior art. In FIG. 2, reference numeral 1 designates a monocrystalline substrate of Si. Reference numeral 2 designates a barrier layer disposed on each of the upper and lower surfaces of the Si substrate 1 to be in ohmic contact therewith. This barrier layer 2 comprises a layer Ti layer 21, a layer Ni layer 22, and a layer Ag layer 23 successively deposited outwardly from the substrate. Reference numeral 4 designates a solder layer of Pb or Sn (or an alloy layer) produced by evaporation on the barrier layer 2.

The function of this submount for semiconductor laser element will be described.

Generally, when a semiconductor laser element is under continuous oscillation, it generates heat and therefore the laser is fixed to a radiating block (i.e., a heat sink) thereby to radiate heat. Ag or Cu, each having a high thermal conductivity-are widely used as radiation blocks. However, since a semiconductor laser element comprising for example AlGaAs, and Ag or Cu have a large thermal expansion coefficient difference, a submount formed of a Si monocrystal is inserted between the semiconductor laser element and the heat radiation block. This submount is used as heat stress relaxation material.

The process for producing the submount for a semiconductor laser element which is shown in FIG. 2 is the following.

First—Ti layers 21, Ni layers 22, and Ag layers 23 are successively deposited on the front and rear surfaces of the Si wafer substrate 1 by evaporation. This Ti layer 21 adheres well to the Si substrate 1 and can form an ohmic contact with the Si substrate 1. The Ni layer 22 can suppress the metal alloy reaction between the PbSn solder layer 4 and the Ti layer 21. The Ag layer 23 can prevent the oxidation of the Ni layer 22 and provide a good plating property for PbSn solder. These metal layers can also be produced by sputtering. Next, Pb and Sn are respectively evaporated onto the Ag layer 23, or an alloy of Pb and Sn is evaporated onto the Ag layer 23, to produce a solder layer 4.

When a semiconductor laser element is mounted on a heat radiation block with the above-described Si submount, a junction down construction method in which the light emitting point of the semiconductor laser element is arranged close to the submount is utilized to lower the heat resistance. This junction down construction method is becoming a main method used in high power lasers and laser printers in which low heat characteristics are required.

When Au series is used as solder, although it has good adherence, it has a high fusing point and strength. Heat stress distortion is likely to be produced in the semiconductor laser chip after the solder hardens, thereby reducing long period reliability. Accordingly, PbSn series solder which has a low fusing point and is also soft is mainly used as the solder in the junction down structure; since PbSn solder is soft solder, when a semiconductor laser chip is adhered thereby, the life time characteristics of the semiconductor laser (usually called a laser diode) is good. However, there are following problems.

A semiconductor laser has a pair of resonator end surfaces, and laser light is emitted from the front surface and rear surface of the resonator. There is a proportional relationship between the laser light output which is emitted from the front surface and the laser light output which is emitted from the rear surface. Generally, in order to obtain a constant laser light output from the front surface (APC driving), a monitor photodiode which receives light emitted from the rear surface is included in a package to monitor the rear side laser light. In a case of above-described junction down construction, laser light incident on the monitor photodiode, comprises direct light emitted from the rear surface of the laser resonator and light reflected from the surface of the PbSn series solder at the uppermost surface of the submount. In case of PbSn series solder, the reflectance thereof varies with the number of heat cycles as shown in FIG. 3(a). The quantity of light incident on the monitor photodiode changes, thereby disabling APC driving, and an over current is applied to the semiconductor laser element which causes deterioration of the semiconductor laser element.

Furthermore, PbSn series solder is susceptible to thermal fatigue, and to chips have detached due to lack of adhesive strength after at about 100 heat cycles.

In the semiconductor laser element submount of such a construction, the surface state of the solder is likely to change, and the quantity of light incident on the monitor photodiode varies thereby to varying the monitor current, preventing APC driving. Furthermore, PbSn solder is susceptible to thermal fatigue and to chip detachment.

SUMMARY OF THE INVENTION

An object of the present invention is to provide a submount for a semiconductor laser element capable of eliminating variations in monitor current, eliminating adhesion failures due tho thermal fatigue, and having a high reliability including long-term aging characteristics.

Other object and advantages of the present invention will become apparent from the detailed description given hereinafter; it should be understood, however, that the detailed description and specific embodiment are given by way of illustration only, since various changes and modifications within the spirit and scope of the invention will become apparent to those skilled in the art from this detailed description.

According to the present invention, the uppermost surface layer of a submount for a semiconductor laser element is a metal alloy solder layer comprising Sn, Ag, and Sb on a barrier layer comprising Au or Ag.

Accordingly, the metal alloy solder layer has good adhesion good adhesion and little likelihood of thermal fatigue due to heat cycle, and furthermore, lack of adhesive strength is eliminated and the surface state of solder is unlikely to change, thereby reducing the variation in monitor current characteristics and resulting in a high reliable laser diode.

BRIEF DESCRIPTION OF THE DRAWINGS

FIG. 3(a) is a diagram showing heat cycle characteristics of the monitor current of a semiconductor laser element using a submount according to the prior art; and FIG. 3(b) is a diagram showing heat cycle characteristics of the monitor current of a semiconductor laser element using a submount according to an embodiment of the present invention.

DETAILED DESCRIPTION OF THE PREFERRED EMBODIMENTS

An embodiment of the present invention will be described in detail with reference to the drawings.

Figure 1:
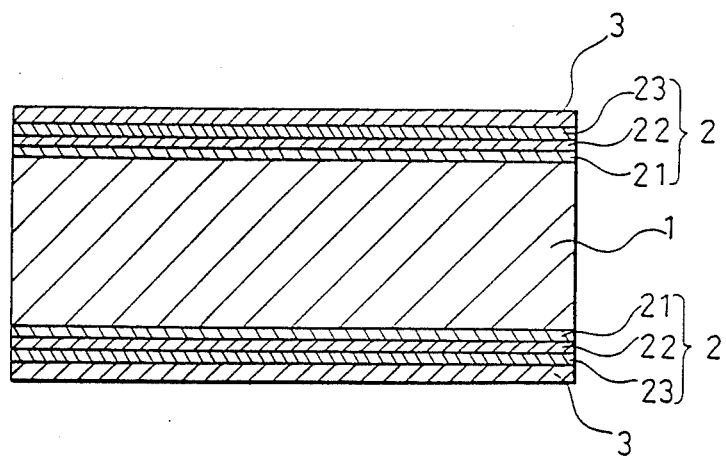
FIG. 1 is a cross-sectional view showing a construction of a submount for semiconductor laser element according to an embodiment of the present invention.
Figure 2:
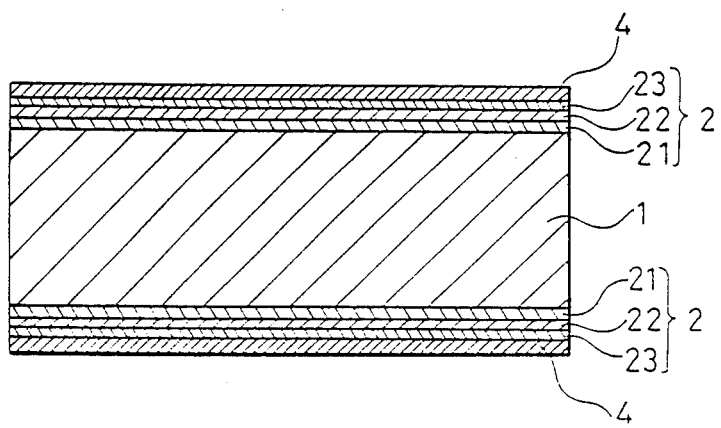
FIG. 2 is a cross-sectional view showing a submount for semiconductor laser element according to the prior art.

FIG. 1 shows a submount for a semiconductor laser element according to an embodiment of the present invention. In FIG. 1, reference numeral 1 designates a Si conductive substrate. Reference numeral 2 designates a barrier layer comprising a Ti layer 21, a Ni layer 22, and a Ag layer 23 successively deposited on each of the surfaces of Si substrate 1 by evaporation. Reference numeral 3 designates a metal alloy solder layer comprising Sn, Ag, and Sb deposited on the barrier layer 2 by evaporation.

The operation and effect will be described.

In this embodiment, a solder layer is produced by a metal alloy comprising Sn, Ag, and Sb. Table 1 shows mechanical characteristics of the solder material. As shown in this table, metal alloy solder of containing Sn, Ag, and Sb has hardness of 3.5 $H_v$. This is a soft solder—softer than the PbSn series solder. Furthermore, the metal alloy solder comprising Sn, Ag, and Sb is not likely to be subject to thermal fatigue and the surface state of solder is not likely to change.

TABLE 1

| kind | electric conductivity (IACS %) *1 | hardness | expansion intensity (MPa) | thermal expansion coefficient ($\times 10^{-6}$) |
|---|---|---|---|---|
| $Sn_{65}Ag_{25}Sb_{10}$ | 9~10% | 3.5 ($H_v$) | 97~100 | |
| $Au_{97}Si_3$ | 54% | | 255(23° C.) 229(100° C.) | 12.33 |
| $Au_{80}Sn_{20}$ | | 63 ($H_B$) | 275(23° C.) 269(100° C.) | 15.93 |
| $Pb_{20}Sn_{80}$ | | 18.2 ($H_v$) | 61.9(20° C.) 44.6(50° C.) | 23.0 |
| $Pb_{95}Sn_5$ (LA solder) | 8.2% | 8.0 ($H_B$) | 30.4 | 28.7 |

(*1: in case where copper is to be of 100%)

From the above characteristics, in an element in which a semiconductor laser chip is junction down based onto a submount for according to the present embodiment, there is no chip detachment and no characteristics causing deviation of the monitor current Im through least at 700 heat cycles. The same performance as PbSn series solder has been obtained in long-term aging, evaluations, which are containing.

In this way, in this embodiment, a metal alloy solder comprising Sn, Ag, and Sb which is a low heat stress soft solder softer than PbSn series solder and resistant to thermal fatigue and change in its surface state is used as a solder layer for the submount for a semiconductor laser element. Therefore good long-term aging is obtained, chip detachment is eliminated, and a highly reliable semiconductor laser element having no variation in its monitor current is obtained.

While in the above-illustrated embodiment solder is disposed over all of both surfaces of the Si substrate, a solder layer may be disposed partially on those surfaces.

While in the above-illustrated embodiment a Si conductive substrate is used, the substrate may be of insulator.

For example, when a plurality of laser chips are mounted on the submount, a solder layer may be partially produced on an insulating substrate and laser chips may be mounted on a solder layer, thereby easily producing lasers which are driven independently.

As is evident from the foregoing description, according to the present invention, the solder is produced by a metal alloy solder comprising Sn, Ag, and Sb which is a soft than PbSn series solder, whereby the long-term ageing property is good thermal fatigue is unlikely there is no chip detachment no deviation in the the monitor current due to surface state change are obtained, and a high reliability semiconductor element is produced.

What is claimed is:

1. A submount for a semiconductor laser element comprising:
   a substrate having a surface;
   a barrier layer disposed on the surface of said substrate, said barrier layer including a plurality of layers successively deposited on said substrate, the outermost layer of said barrier layer being one of Au and Ag; and
   an alloy solder layer comprising about 65 weight percent Sn, about 25 weight percent Ag, and about 10 weight percent Sb disposed on said outermost surface of said barrier layer for attachment of a semiconductor laser element to the submount.

2. The submount of claim 1 wherein said substrate is electrically conducting.

3. The submount of claim 1 wherein said substrate is electrically insulating.

4. The submount of claim 1 wherein said solder layer is disposed on the entire outermost surfaces of the barrier laters.

5. The submount of claim 1 wherein said solder layer is disposed on only part of the outermost surface of at least one of said barrier layers.

* * * * *